(12) United States Patent
Grupp et al.

(10) Patent No.: US 6,985,842 B2
(45) Date of Patent: Jan. 10, 2006

(54) BIDIRECTIONAL WIRE I/O MODEL AND METHOD FOR DEVICE SIMULATION

(75) Inventors: Richard J. Grupp, Milton, VT (US); Yelena M. Tsyrkina, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 910 days.

(21) Appl. No.: 09/854,038

(22) Filed: May 11, 2001

(65) Prior Publication Data

US 2002/0169588 A1    Nov. 14, 2002

(51) Int. Cl.
*G06F 17/50*    (2006.01)
(52) U.S. Cl. .............................. 703/15; 703/13; 703/14
(58) Field of Classification Search ................... 703/15
See application file for complete search history.

(56) References Cited

U.S. PATENT DOCUMENTS

| | | | | |
|---|---|---|---|---|
| 4,963,863 | A * | 10/1990 | Hofmann .................... 340/2.29 |
| 5,202,593 | A * | 4/1993 | Huang et al. .................. 326/86 |
| 5,396,435 | A * | 3/1995 | Ginetti ........................... 716/6 |
| 5,428,750 | A * | 6/1995 | Hsieh et al. ................. 710/305 |
| 5,455,521 | A * | 10/1995 | Dobbelaere ................... 326/17 |
| 5,455,928 | A * | 10/1995 | Herlitz ......................... 703/13 |
| 5,801,549 | A * | 9/1998 | Cao et al. ...................... 326/83 |
| 5,923,187 | A * | 7/1999 | Maugars ....................... 326/86 |
| 6,442,738 | B1 * | 8/2002 | Brehmer ........................ 716/5 |
| 6,480,817 | B1 * | 11/2002 | Peters et al. .................. 703/15 |
| 6,496,955 | B1 * | 12/2002 | Chandra et al. ............... 716/3 |
| 6,553,338 | B1 * | 4/2003 | Buch et al. ................... 703/14 |
| 6,587,999 | B1 * | 7/2003 | Chen et al. ..................... 716/6 |
| 6,751,744 | B1 * | 6/2004 | Allen et al. ................. 713/401 |
| 6,763,503 | B1 * | 7/2004 | Yang et al. ..................... 716/4 |
| 6,909,307 | B2 * | 6/2005 | Mitarashi ...................... 326/56 |

OTHER PUBLICATIONS

A symmetric CMOS NOR gate for high-speed applications Johnson, M.G.; Solid-State Circuits, IEEE Journal of , vol.: 23 , Issue: 5 , Oct. 1988 pp.:1233-1236.*
Regenerative feedback repeaters for programmable interconnections; Dobbelaere, I.; Horowitz, M.; El Gamal, A.; Solid-State Circuits, IEEE Journal of vol. 30, Issue 11, Nov. 1995 Page(s):1246-1253.*
A practical interconnect driven ASIC design procedure; Mely Chen Chi; Tseng, J.M.; Lee, C.Y.; Huang, S.H.;ASIC Conference 1998. Proceedings. Eleventh Annual IEEE International; Sep. 13-16, 1998 Page(s):233-237 □□.*

(Continued)

*Primary Examiner*—Jean R. Homere
*Assistant Examiner*—Akash Saxena
(74) *Attorney, Agent, or Firm*—Schmeiser, Olsen & Watts; Richard M. Kotulak (57) ABSTRACT

A system and method is provided to accurately model bidirectional wire I/O using hardware description language (HDL). The preferred model and method uses an HDL model that provides two parallel paths between ports of the bidirectional wire I/O. During simulation, the ports are monitored for activity. When an event is detected on either port, the model checks both ports to see if they are different values. If the ports are different values, one of the two parallel paths is enabled and the other disabled. For example, the model enables the path in which the new signal has appeared and thus passes the signal to the other port. The preferred model allows for the use of HDL elements that support full timing annotation. The preferred embodiment also removes the possibility of high impedance transition error that can result from false transitions to a high impedance state.

24 Claims, 6 Drawing Sheets

OTHER PUBLICATIONS

An automatic direction control scheme for bi-directional bus repeaters with dynamic collaborative driving Nomura, M. et al. VLSI Circuits, 2004. Digest of Technical Papers. Jun. 17-19, 2004 Page(s):388-391.*

A practical interconnect driven ASIC design procedure; Mely Chen Chi; Tseng, J.M.; Lee, C.Y.; Huang, S.H.;ASIC Conference 1998. Proceedings. Eleventh Annual IEEE International; Sep. 13-16, 1998 Pages(s):233-237.*

" MOS modelling technique for 4-state true-value hierarchical logic simulation or Karnough knowledge"; Will Sherwood; Annual ACM IEEE Design Automation Conference archive; pp.: 775-785;1981.*

"Transmission gate modeling in an existing three-value simulator"; Robert M. McDermott; Proceedings of the nineteenth design automation conference, p. 678-681, Jan. 1982.*

* cited by examiner

VERILOG EXAMPLE

```
module BiDiWireIO (PORT_A, PORT_B);
inout PORT_A, PORT_B;
reg c1, c2;

initial begin
c1=1 'b0;
c2=1 'b0;
end nmos A1    (PORT_A, n, c1);
nmos A3    (n, PORT_B, 1 'b1);

nmos A2    (PORT_B, m, c2);
nmos A4    (m, PORT_A, 1 'b1);

always @ (m)
if (m !== n) begin
   c1 = 0;
   c2 = 1;
end always @ (n)
if (m !== n) begin
   c1 = 1;
   c2 = 0;
end specify
   (PORT_B +=> PORT_A) = (0.0:0.0:0.0 , 0.0:0.0:0.0);
   (PORT_A +=> PORT_B) = (0.0:0.0:0.0 , 0.0:0.0:0.0);
endspecify endmodule
```

VITAL HDL EXAMPLE (PART 1)

```
library IEEE;
use IEEE.STD_LOGIC_1164.all;
library IEEE;
use IEEE.VITAL_Timing.all;

-- entity declaration --
entity BiDiWireIO is
    generic (
        tpd_PORT_B_PORT_A          : VitalDelayType01 := 
(0.100 ns, 0.100 ns) ;
        tpd_PORT_A_PORT_B          : VitalDelayType01 := 
(0.100 ns, 0.100 ns) ;
        tipd_PORT_A                : VitalDelayType01 := (0.100
ns, 0.100 ns) ;
        tipd_PORT_B                : VitalDelayType01 := 
(0.100 ns, 0.100 ns) ;

port (
        PORT_B                     : inout STD_LOGIC;
        PORT_A                     : inout STD_LOGIC);
attribute VITAL_LEVEL0 of BiDiWireIO : entity is TRUE;
end BiDiWireIO ;

-- architecture body --
library IEEE;
use IEEE.VITAL_Primitives.all;
architecture ARCH_VITAL of BiDiWireIO is SIGNAL PORT_B_ipd          : STD_LOGIC := 'Z';
    SIGNAL PORT_A_ipd          : STD_LOGIC := 'Z';

SIGNAL PORT_B_zd           : STD_LOGIC := 'Z';
    SIGNAL PORT_A_zd           : STD_LOGIC := 'Z';

SIGNAL c1                  : STD_LOGIC := '0';
    SIGNAL c2                  : STD_LOGIC := '0';

begin

WireDelay : block
    begin
    VitalWireDelay (PORT_A_ipd, PORT_A, tipd_PORT_A) ;
    VitalWireDelay (PORT_B_ipd, PORT_B, tipd_PORT_B);
    end block;
```

FIG. 5

VITAL HDL EXAMPLE (PART 2)

```
PORT_A_zd <= PORT_B_ipd  when c1 = '1' else 'Z';
PORT_B_zd <= PORT_A_ipd  when c2 = '1' else 'Z';

c1 <= '1' when PORT_B 'event and (PORT_A /= PORT_B) else
      '0' when PORT_A 'event and (PORT_A /= PORT_B) else
      c1;

c2 <= '0' when PORT_B 'event and (PORT_A /= PORT_B) else
      '1' when PORT_A 'event and (PORT_A /= PORT_B) else
      c2;

VITALBehavior : process (PORT_A_zd, PORT_B_zd)

variable PORT_A_GlitchData    : VitalGlitchDataType;
    variable PORT_B_GlitchData    : VitalGlitchDataType;

begin
    VitalPathDelay01 (
      OutSignal => PORT_A,
      GlitchData => PORT_A_GlitchData,
      OutSignalName => "PORT_A",
      OutTemp => PORT_A_zd,
      Paths => (0 => (PORT_B_ipd 'last_event,
tpd_PORT_B_PORT_A, TRUE)),
      Mode => OnDetect,
      Xon => True,
      MsgOn => True,
      MsgSeverity => WARNING) ;

VitalPathDelay01 (
      OutSignal => PORT_B,
      GlitchData => PORT_B_GlitchData,
      OutSignalName => "PORT_B",
      OutTemp => PORT_B_zd,
      Paths => (0 => (PORT_A_ipd 'last_event,
tpd_PORT_A_PORT_B, TRUE)),
      Mode => OnDetect,
      Xon => True,
      MsgOn => True,
      MsgSeverity => WARNING) ;

end process;
end ARCH_VITAL
```

FIG. 6

BIDIRECTIONAL WIRE I/O MODEL AND METHOD FOR DEVICE SIMULATION

BACKGROUND OF THE INVENTION

1. Technical Field

The present invention generally relates to the design of very large scale integrated (VLSI) circuits and, more specifically to computer aided design (CAD) tools used in the modeling and simulation of very large scale integrated circuits.

2. Background Art

Modem electronic devices are constantly increasing in complexity and sophistication. As such, there is a constant need for improvements in the tools used to design and build modem electronic devices. Of particular importance are the tools used to model modem electronic devices.

Modem electronic devices have become so complex that it is virtually impossible to simply design and build devices with the expectation that they will function correctly the first time. As such, it is usually necessary for a design engineer to model a new circuit design to determine if it functions correctly before proceeding with the design and build process.

Hardware description languages (HDL) are a type of programming-like language used to describe electronic components in a textual rather than schematic way. Thus, HDLs allow designers to represent the functionality of a electronic device as a software program. The HDL model of an electronic device can then be simulated on a computer to see if the design will function as intended. Any problems in the design can then be corrected in the HDL model, and the correction retested with another simulation. Thus, HDLs help design engineers avoid problems that could otherwise be undetected. By modeling the hardware first, problems with the design can be detected during simulation and fixed before the hardware is actually built.

One issue with current HDL techniques is in the modeling of bidirectional wire input/outputs (I/O's). Bidirectional wire I/O is the general term for any connection that serves as both an input and an output to electronic devices. For example, bidirectional wire I/O's include the wire connection between logic circuits on VLSI chips and the packaging interconnect, the wire bond between the VLSI chips and the encapsulating package, and the leads or connection solder balls that are used to connected to packaged integrated circuit devices. The modeling of bidirectional wire I/Os is especially important for simulation of digital electronic devices. The modeling of bidirectional I/O's is complicated by the necessity of accurate timing information for signal flow in both directions. Current method of modeling bidirectional I/O's use simple switch based models to represent the bidirectional wire I/O. For example, when using the Verilog HDL language, TRAN primitives have been used as the switch to model the bidirectional wire I/O's. The TRAN primitive provides the basic functionality of the switch which is used in the model. These switch based models, while satisfying the functional requirements of modeling the bidirectional wire I/O, cannot meet the timing annotation requirements needed for accurate simulation.

Another problem in some simple HDL models is that modeling these models sometimes caused incorrect state transitions, resulting in simulation failure. For example, in some Vital HDL models, a behavioral model that used a break-before-make operation was used to model bidirectional wire I/O's. Unfortunately, the break-before-make behavior caused the model to go into a high impedance state before going into its final state. This extra transition would cause problems in some simulations. For example, when used to model a clock such a false transition to a high impedance state could cause false clock events downstream.

Thus, there currently exists no method or system that facilitates timing accurate modeling of bidirectional wire I/O's using HDL models. Therefore, what is needed is an improved method for bidirectional wire I/O modeling.

DISCLOSURE OF INVENTION

According to the present invention, a system and method is provided to accurately model bidirectional wire I/O using HDL. The preferred method uses an HDL model that provides two parallel paths between ports of the bidirectional wire I/O. During simulation, the ports are monitored for activity. When an event is detected on either port, the model checks both ports to see if they are different values. If the ports are different values, one of the two parallel paths is enabled and the other disabled. For example, the model enables the path in which the new signal has appeared and thus passes the signal to the other port. The preferred model allows for the use of HDL elements that support full timing annotation. The preferred embodiment also removes the possibility of high impedance transition error that can result from false transitions to a high impedance state.

The preferred embodiment of the present invention thus implements the bidirectional wire I/O HDL model using two parallel paths between the nodes of the bidirectional wire I/O. In one embodiment, the HDL model uses two NMOS devices in each of the two parallel paths. These two NMOS devices allow the annotation of delays across each of the two parallel paths. This embodiment uses these two devices in each path, with one acting as a pass through device and the other acting as a driving device for the path. The pass through devices are held on, such that inputs are simply passed through the device. The driving device are controlled by HDL register values, and serve as accelerated drivers for signals on the wire I/O. In particular, the driving devices are controlled by behavior control blocks that change in response to sensed port value changes. This allows the bidirectional wire I/O HDL model to accurately model signal propagation in both directions and further allows for control of timing delays in both directions.

In another embodiment, the model is implemented using behavioral control logic that implements the two parallel paths using a behavior model. The behavior control logic is defined such that when a new event occurs in the model, one port becomes the driving port, the other port driver is de-asserted and the port is assigned the new driving port value.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

According to the present invention, a system and method is provided to accurately model bidirectional wire I/O using HDL. The preferred method uses an HDL model that provides two parallel paths between ports of the bidirectional wire I/O. During simulation, the ports are monitored for activity. When an event is detected on either port, the model checks both ports to see if they are different values. If the ports are different values, one of the two parallel paths is enabled. For example, the model enables the path in which the new signal has appeared, and simultaneously disables the other path, and thus passes the signal to the other port. The preferred model allows for the use of HDL elements that support full timing annotation. The preferred embodiment also removes the possibility of high impedance transition error that can result from false transitions to a high impedance state.

The preferred embodiment of the present invention thus implements the bidirectional wire I/O HDL model using two parallel paths between the nodes of the bidirectional wire I/O. In a first embodiment, the HDL model is implemented using Verilog. The Verilog implementation uses two NMOS devices in each of the two parallel paths. These two NMOS devices allow the annotation of delays across each of the two parallel paths. This embodiment uses these two devices in each path, with one acting as a pass through device and the other acting as a driving device for the path. The pass through devices are held on, such that inputs are simply passed through the device. The driving device are controlled by HDL register values, and serve as accelerated drivers for signals on the wire I/O. In particular, the driving devices are controlled by behavior control blocks that change in response to sensed port value changes. This allows the bidirectional wire I/O HDL model to accurately model signal propagation in both directions and further allows for control of timing delays in both directions.

In another embodiment, the model is implemented using Vital HDL that defines behavioral control logic that implements the two parallel paths using a behavior model. The behavior control logic is defined such that when an new event occurs in the model, one port becomes the driving port, the other port driver is de-asserted and the port is assigned the driving port value.

Figure 1:
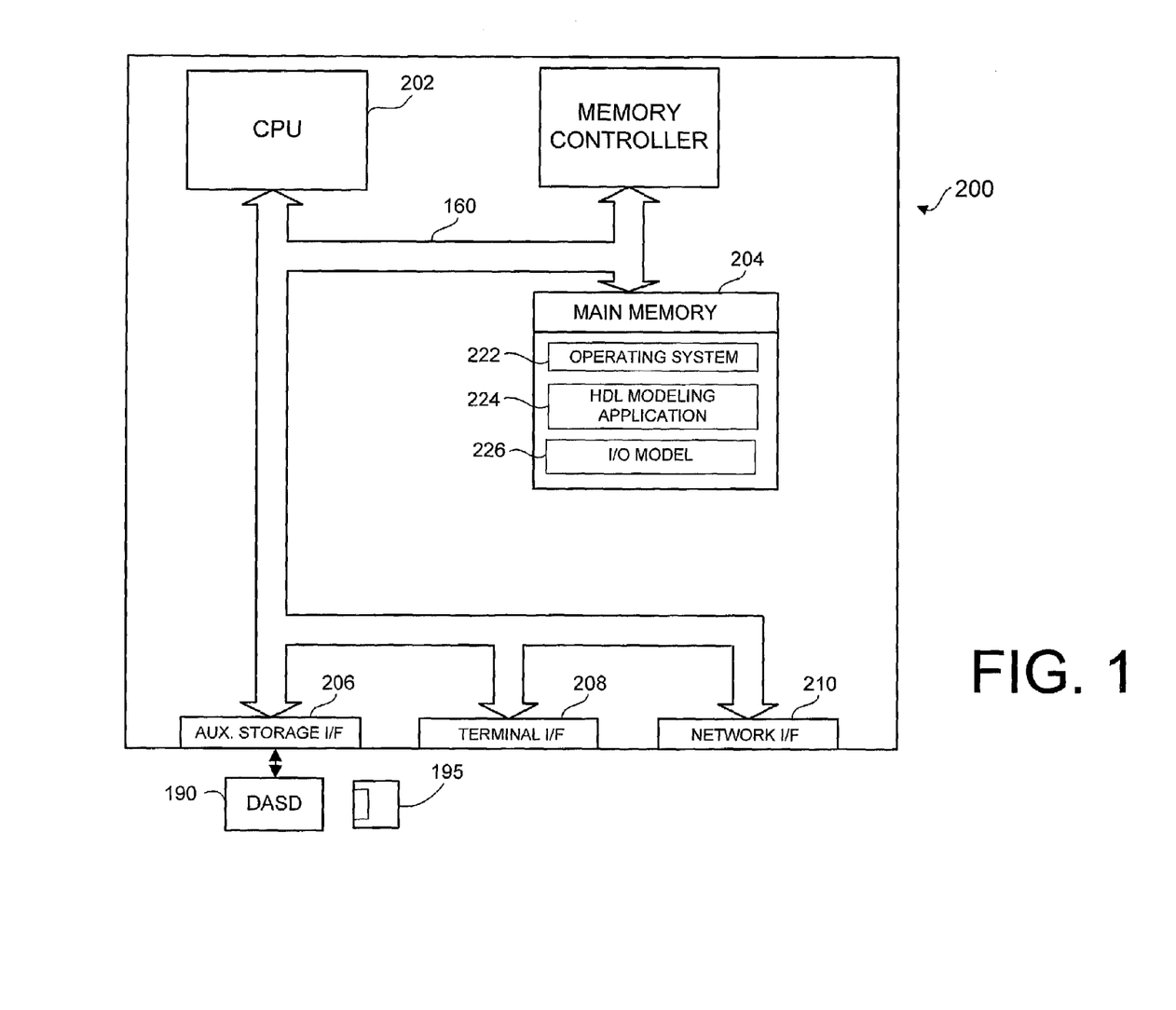
FIG. 1 is a block diagram of a computer system 200.

Referring now to FIG. 1, a block diagram of a computer system 200 is shown to illustrate a preferred embodiment of the present invention. The computer system 200 can be any suitable system, such as an IBM compatible personal computer, a Unix workstation, or a network computer. However, those skilled in the art will appreciate that the mechanisms and apparatus of the present invention apply equally to any computer system, regardless of whether the computer system is a complicated multi-user computing apparatus or a single user personal computer. As shown in the block diagram of FIG. 1, computer system 200 comprises main or central processing unit (CPU) 202 connected to main memory 204, auxiliary storage interface 208, terminal interface 208, and network interface 210. These system components are interconnected through the use of a system bus 160. Auxiliary storage interface 206 is used to connect mass storage devices (such as DASD devices 190 which stores data on a disk 195) to computer system 200.

It is important to note that while the present invention has been (and will continue to be) described in the context of a fully functional computer system, those skilled in the art will appreciate that the mechanisms of the present invention are capable of being distributed as a program product in a variety of forms, and that the present invention applies equally regardless of a particular type of signal bearing media used to actually carry out the distribution. Examples of signal bearing media include: recordable type media such as floppy disks, CD-ROMs and transmission type media such as digital and analog communication links.

Main memory 204 contains an operating system 222 and HDL modeling application 224. In accordance with the preferred embodiment the main memory will also include an I/O model 226. As will be described in greater detail later, the I/O model 226 provides the ability to accurate model bidirectional wire I/O.

Computer system 200 preferably utilizes well known virtual addressing mechanisms that allow the programs of computer system 200 to behave as if they only have access to a large, single storage entity instead of access to multiple, smaller storage entities such as main memory 204 and DASD devices. Therefore, while operating system 222, HDL Modeling application 224, I/O model 226 are shown to reside in main memory 204, those skilled in the art will recognize that these programs are not necessarily all completely contained in main memory 204 at the same time. It should also be noted that the term "memory" is used herein to generically refer to the entire virtual memory of computer system 200.

Although computer system 200 is shown to contain only a single main CPU and a single system bus, those skilled in the art will appreciate that the present invention may be practiced using a computer system that has multiple CPUs and/or multiple buses.

Terminal interface 208 is used to directly connect one or more terminals to computer system 200. These terminals may be non-intelligent or fully programmable workstations, and are used to allow system administrators and users to communicate with computer system 200.

Network interface 210 is used to connect other computer systems and/or workstations to computer system 200 in networked fashion. For example, the network interface can include a connection to the Internet and the World-Wide-Web or internal web-based systems (typically called intranets). The present invention applies equally no matter how computer system 200 may be connected to other computer systems and/or workstations, regardless of whether the connection is made using present-day analog and/or digital techniques or via some networking mechanism of the future.

Operating system 222 can be any operating system, such as Unix, Linux, OS/2, Windows, AIX, OS/400, etc, but is preferably an operating system that provides robust environment needed for the design and testing of modern integrated circuit, and those skilled in the art will appreciate that the spirit and scope of the present invention is not limited to any one operating system.

HDL modeling application program 224 provides for the simulation of integrated circuits expressed in any suitable HDL language. Again, Hardware description languages (HDL) are a type of programming-like language used to describe electronic components that facilitates the modeling and testing of circuit designs. HDLs allow circuit designs to be described in textual, rather than schematic ways. Thus, HDLs allow designers to represent the functionality of a electronic device as a software program. Suitable languages for implementing the invention include Verilog and Vital HDL. Other event based languages could also be used, including common programming languages.

The HDL model of an electronic device can be simulated on a computer using a suitable HDL modeling application program 224 to see if the design will function as intended. Any problems in the design can then be corrected in the HDL model, and the correction retested with another simulation. Thus, HDLs help design engineers avoid problems that could otherwise be undetected.

The HDL modeling application program 224 can comprise any suitable modeling application. For example, Verilog XL, NC-VHDL and NC-Verilog from Cadence, Inc., VCS and VSS from Synopsis, Inc., and Model SIM from Mentor Graphics are examples of suitable modeling applications. Of course, other suitable modeling applications can be used depending on the HDL language used to implement the invention.

The preferred embodiment I/O model 226 implements the bidirectional wire I/O HDL model using two parallel paths between the nodes of the bidirectional wire I/O, with two devices in each of the two parallel paths. The preferred I/O model 226 allows for the use of HDL elements that support full timing annotation. This also removes the possibility of high impedance transition error that can occur in some simulations.

The I/O model 226 can be implemented using any suitable HDL language. Preferably, the HDL language used is one that supports timing annotation. For example, the I/O model 226 can be implemented in the Verilog language, in the VHDL, and in Vital HDL. Of course, the I/O model 226 can be implemented in any other suitable HDL language that provides for event based programming. It could also be used in a general purpose programing language, such as C or C++.

Figure 2:
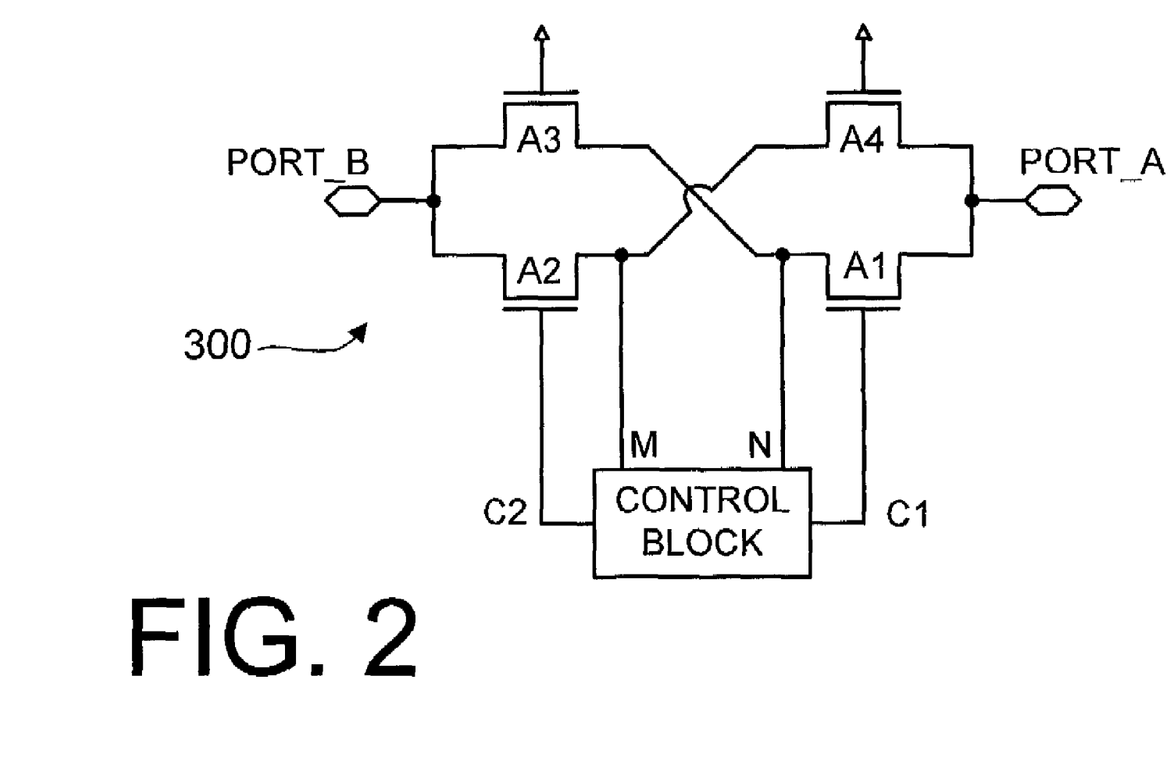
FIG. 2 is a schematic view of bidirectional wire I/O model 300.

Turning now to FIG. 2, a schematic drawing of a bidirectional wire I/O model 300 is illustrated. The bidirectional wire I/O model 300 models the wire I/O by providing two parallel paths between the nodes of the bidirectional wire I/O, with two devices in each of the two parallel paths. In model 300, the first path, between Port A and Port B is through NMOS device A4 and NMOS device A2. Likewise, the second path, between Port B and Port A is through NMOS device A3 and NMOS device A1. NMOS devices A3 and A4 are both implemented with their gates held high, and thus act as pass through devices in their respective paths. These devices also allow for increased timing accuracy by facilitating the storage of module input port delay information (MIPD). NMOS devices A1 and A2 are selectively turned on by the Control Block, and thus are used to selectively drive signals through their respective paths. The operation of the Control Block is preferably controlled by HDL register values. In particular, the Control Blocks sense activity on nodes M and N, and respond by selectively activating devices A1 and A2 using control outputs C1 and C2. Thus, NMOS devices A1 and A2 are selectively controlled based on sensed port values at nodes M and N. This allows the bidirectional wire I/O model 300 to accurately model signal propagation in both directions. Furthermore, these four NMOS device are preferably implemented in HDL in way that allows for the annotation of delays across the two parallel paths.

Figure 3:
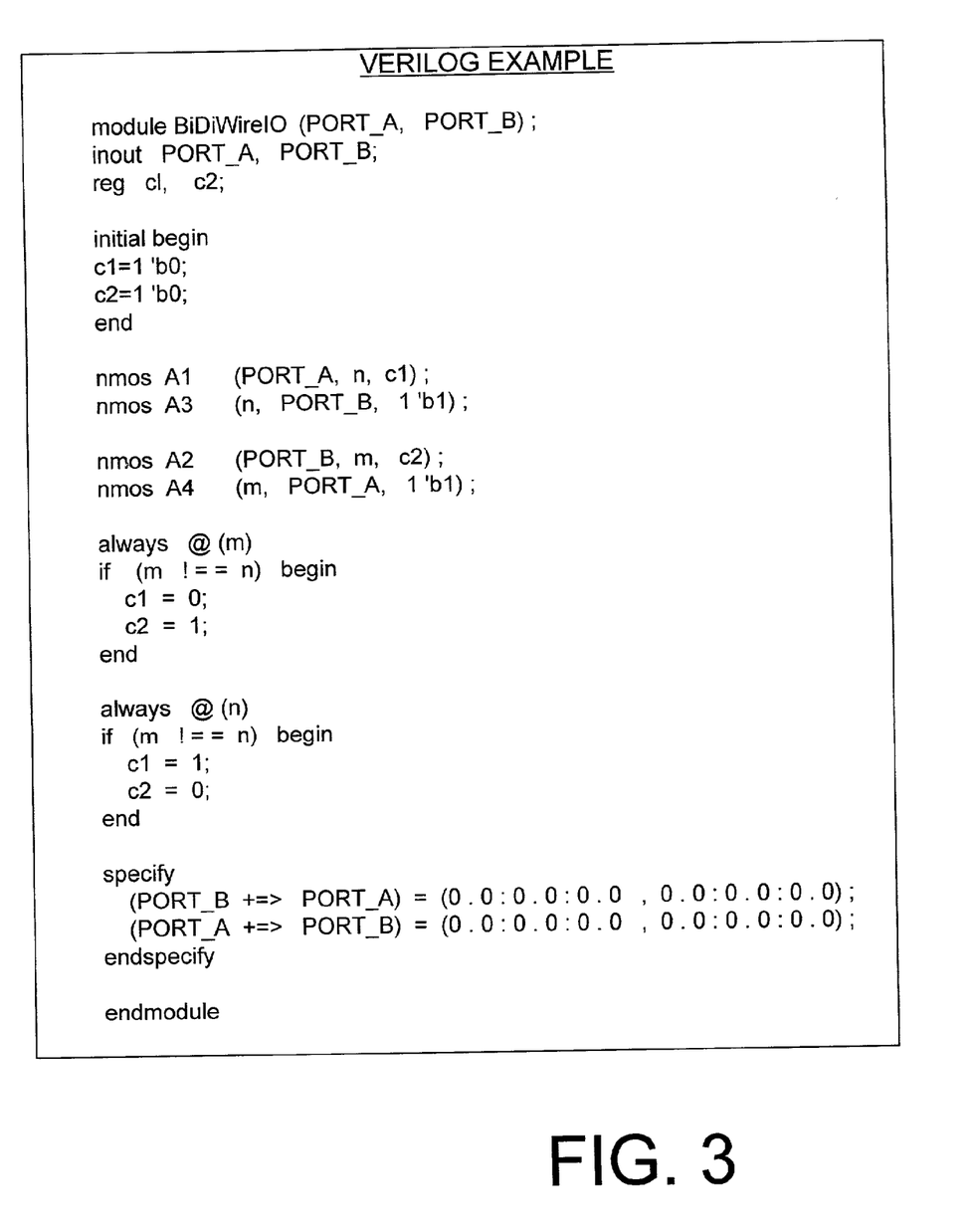
FIG. 3 is a schematic view of exemplary Verilog HDL code used to implement the preferred wire I/O model.
Figure 4:
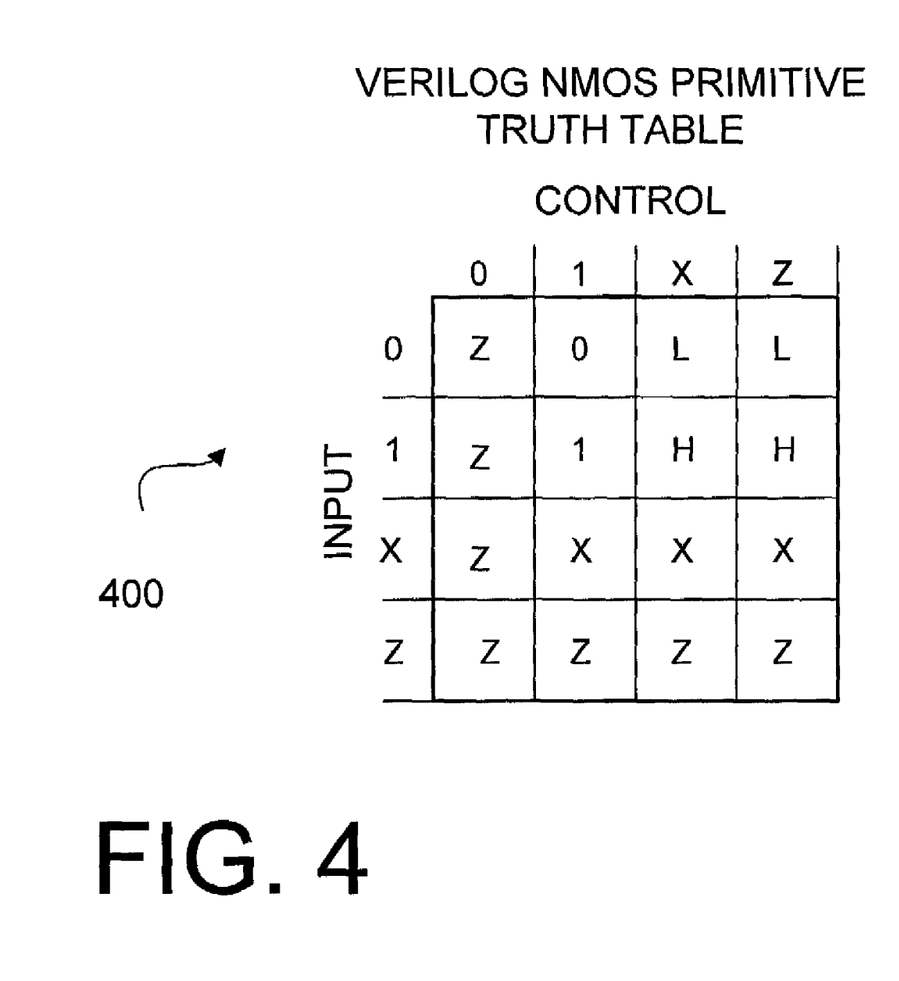
FIG. 4 is a schematic view of an truth table used control the operation of NMOS primitive devices.

Turning now to FIG. 3, an example of Verilog HDL code is illustrated that implements the bidirectional wire I/O model 300 as described above. The example Verilog HDL code thus provides for bidirectional data flow, and the ability to apply all possible back annotated interconnects and propagate delays. In this example, Verilog NMOS primitives are used to implement the four NMOS devices A1, A2, A3 and A4 illustrated in FIG. 3. Verilog primitives are devices that whose operation is defined by the Verilog language. Turning briefly to FIG. 4, FIG. 4 illustrates an exemplary truth table 400. The truth table 400 illustrates how Verilog implements the behavior of NMOS primitives used to model devices A1–A4. Thus, when the input to a Verilog NMOS device is a 0 (modeling the source/drain being at a zero), and the control is a 0 (modeling the gate held low), Verilog treats the NMOS device has being in a high impedance state. This is illustrated by the Z located in the cell at Row 0 and Column Z. When the input is high, the control is high, a high passes through, as illustrated by the 1 at the cell at Row 1 and Column 1. Cells with an X are undetermined. Thus, the Verilog language provides the basic operation of these primitive devices, and this will be used by the preferred I/O model 300. In reading truth table 400, the input to NMOS device A1 is port A and the control input is C1. Likewise, the input to NMOS device A2 is port B and the control input is C2.

Returning to FIG. 3, the "always" statements in the exemplary Verilog HDL code provides the control functionality by assigning register values C1 and C2 when changes are detected in node N or node M. In particular, when a change is propagated to node M, the relative values of M and N are checked, and if node M does not equal node N then C1 is set to 0 and C2 is set to 1. Likewise, when a change is propagated to node N, the relative values of M and N are checked and if node M does not equal node N, then C1 is set to 1 and C2 is set to 0.

In this example, propagation delays are annotated into the simulation of the model using the "specify (PORT_B+>PORT_A)" and specify (PORT_A+>PORT_B) statements. The values for these propagation delays would typically be passed from an appropriate timing tool used to accurately measure the actual timing delays over the I/O. Likewise, interconnect delays can be annotated into the simulation of the model through module input port delays (MIPDs) that are implicit in the Verilog NMOS primitives used to model devices A3 and A4. The overall timing delay is thus the sum total of the propagation and interconnect delays. It should be noted that the interconnect delay is analogous to the wire delay connecting one circuit to the other, while the propagation delay is analogous to the delay from the input of the circuit to the output of the same circuit.

The functional operation during simulation of the bidirectional wire I/O model 300, implemented using Verilog as illustrated in FIG. 3, will now be described. The initial simulation conditions are with both port A and port B at low levels and register values C1 and C2 set at 0. This sets the bidirectional wire I/O model 300 in a high impedance state.

The model can then be stimulated by a signal from either port A or port B. For example, port A is stimulated to a logic 1 to simulate the start of a signal passing from port A to port B. Because the gate of NMOS device A4 is tied high, the logic 1 signal passes through NMOS device A4 to node M. This is the normal operation of a NMOS device A4 according to table 400. The Control Block senses the change in node M. Because M now is a 1, it no longer equals node N, which remains in the Z state.

The control block then forces register value C2 to logic 1, and register value C1 to logic 0. This causes NMOS device A2 to turn on, while leaving NMOS device A1 off. Thus, the logic 1 on node M is passed through NMOS device A2 to port B. This completes the passing of the signal between port A and port B.

Because the gate of NMOS device A3 is tied high, the logic 1 on port B is then passed back to node N. The Control Block senses the transition of node N from Z to 1. Because node N now equals node M, the Control Block is exited without further changes to register values C1 or C2.

Thus, the bidirectional wire I/O model 300 has passed a logic 1 from port A to port B, and then put itself back into a ready state for further events to occur on either port A or port B.

For example, if port B is then stimulated to a logic 0 to simulate the start of a signal passing from port B to port A, that signal passes through NMOS device A3 because the gate of NMOS device A3 is tied high. Thus, the logic 0 signal passes through NMOS device A3 to node N. The Control Block senses the change in node N. Because N now is a 0, it no longer equals node M, which remains in the high state from the previous transition.

The control block then forces register value C1 to logic 1, and register value C2 to logic 0. This causes NMOS device A1 to turn on, and NMOS device A2 to turn off. Thus, the logic 0 on node N is passed through NMOS device A1 to port A. This completes the passing of the signal between port B and port A. Because the gate of NMOS device A4 is tied high, the logic 0 on port A is then passed back to node M. The Control Block senses the transition of node M from Z to 1 Because node N now equals node M, the Control Block is exited without further changes to register values C1 or C2.

Thus, the bidirectional wire I/O model 300 has passed a logic 0 from port B to port A, and then put itself back into a ready state for further events to occur on either port A or port B.

The bidirectional wire I/O model 300 can thus be used to model wire connections in both directions, while providing the ability to annotate timing as necessary and without undesirable false transitions to a high impedance state.

Figure 5:
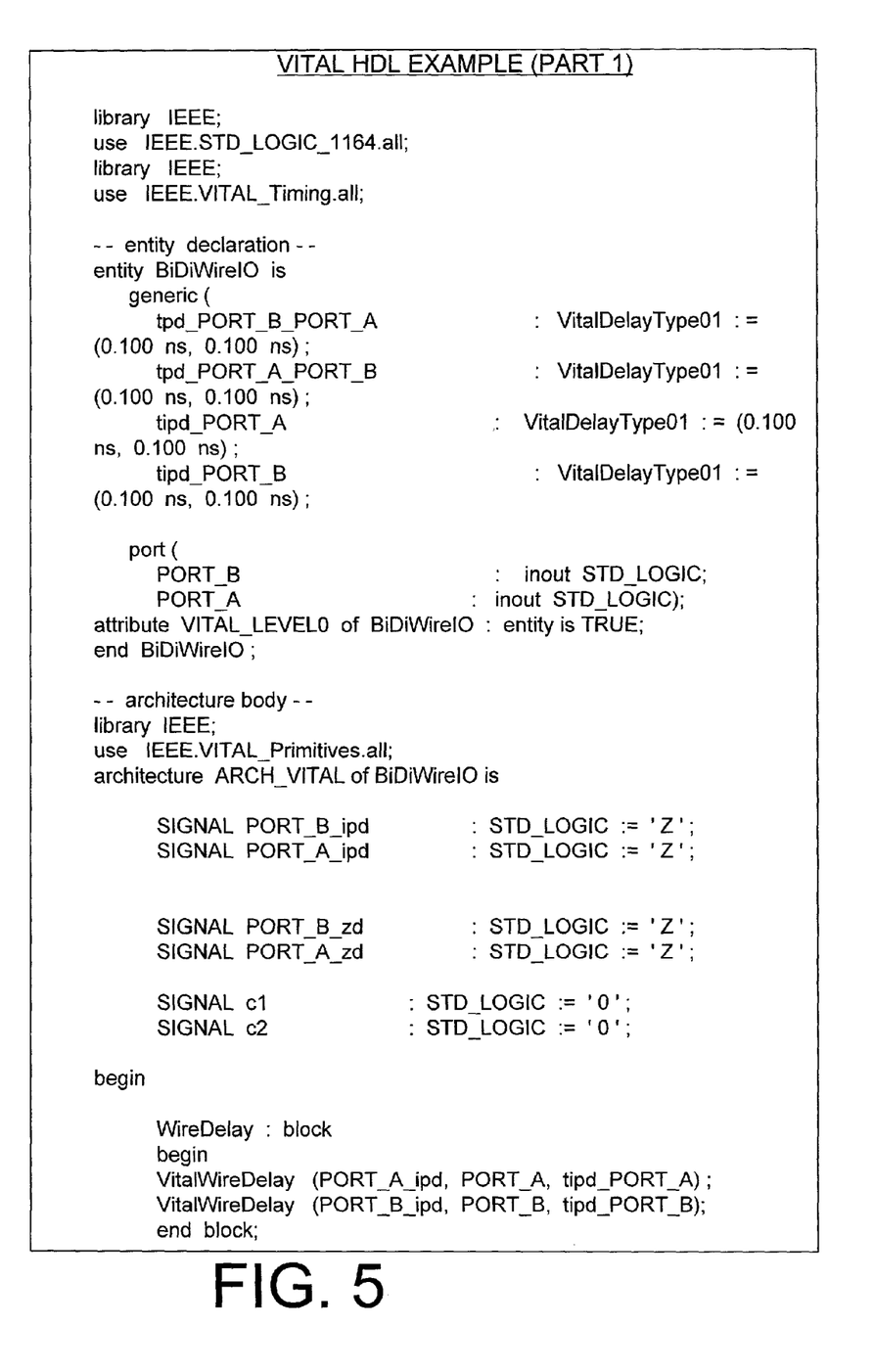
FIGS. 5 and 6 are schematic views of exemplary Vital HDL code used to implement the preferred wire I/O model.
Figure 6:
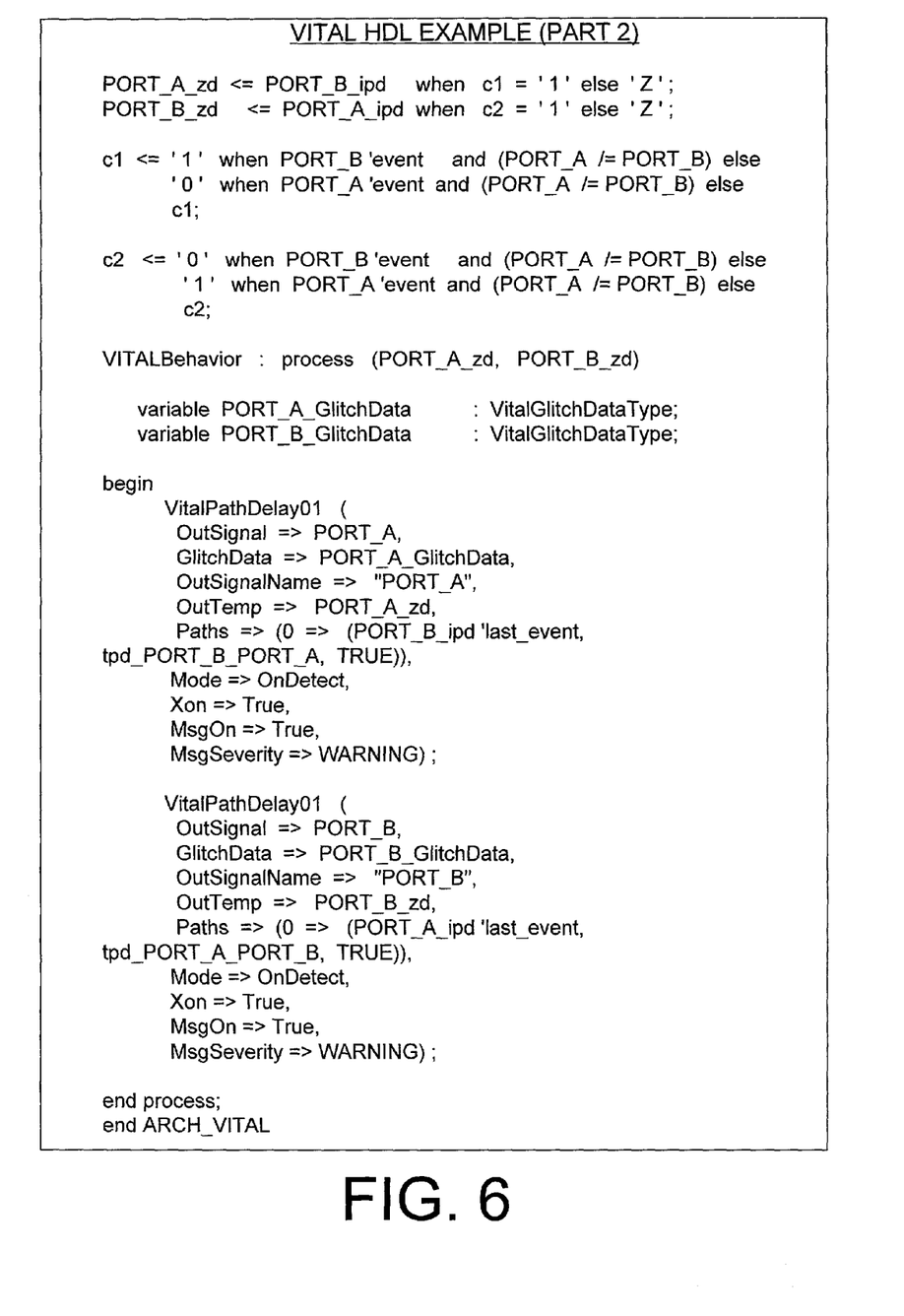

Turning now to FIGS. 5 and 6, an example of Vital HDL code is illustrated that implements the bidirectional wire I/O model as described above. As is known in the art Vital is a technique for overlaying timing information into VHDL programming code. Thus, Vital HDL programming provides the ability annotate timing information into the model in a way similar to the Verilog implementation. However, there are several key differences between the implementations. In particular, the Vital HDL implementation uses a behavioral description rather than using NMOS primitives to model the bidirectional I/O connection.

The Vital HDL implementation method makes use of two parallel path assignments determined by behaviorally controlled signals C1 and C2. When an event occurs in the model, one port becomes the driving port, the other port driver is de-asserted and the port is assigned the driving port value.

The "entity declaration" statements in the Vital HDL code set the timing parameters in Vital HDL and defines the ports. This definition includes timing parameters for propagation delay (e.g., tpd_PORT_B_PORT_A) and for the interconnect delay (e.g., tipd_PORT_A). Thus, the Vital HDL implementation allows for explicit declaration of both the propagation and interconnect delays.

The "architecture body" statements define the functional part of the model and declares that the signals use standard logic and sets their initial values. The "VitalWireDelay" statements assign the back annotated timing delays to the various parameters.

Then next section defines the functional relationships between port A and port B (through intermediate ports) that depend upon the value of C1 and C2. The behavior of the control inputs C1 and C2 is then defined. In particular, when there is an event on port B, C1 is set to 1 and C2 is set to 0 when port A and port B are different, otherwise C1 and C2 are unchanged. Likewise, when there is an event or port A, C1 is set to 0 and C2 is set to 1 when port A and port B are different, otherwise C1 and C2 are unchanged. C1 and C2 then control the VHDL assignment statements that implement the two parallel paths between port A and port B.

The "vital behavior" section then assigns the timing delays by calling the VitalPathDelay01 routines.

One key advantage of the Vital HDL model implementation illustrated in FIGS. 5 and 6 is that it does not suffer from the possibility of high impedance transition error that can result from false transitions to a high impedance state.

The preferred embodiments of the present invention thus provide a model and method to accurately model bidirectional wire I/Os using HDL. This method uses an HDL model that provides two parallel paths between ports of the bidirectional wire I/O. During simulation, the ports are monitored for activity. When an event is detected on either port, the model checks both ports to see if they are different values. If the ports are different values, one of the two parallel paths is enabled. For example, the model enables the path in which the signal has appeared and thus passes the signal to the other port. The preferred model allows for the use of HDL elements that support full timing annotation. The preferred embodiment also removes the possibility of high impedance transition error that can result from false transitions to a high impedance state.

While the invention has been particularly shown and described with reference to a preferred exemplary embodiment thereof, it will be understood by those skilled in the art that various changes in form and details may be made therein without departing from the spirit and scope of the invention.

What is claimed is:

1. A model for representing a bidirectional wire input/output (I/O) during computer simulation of an electronic device, the model being tangibly embodied in a computer readable memory unit that comprises a Hardware Description Language (HDL) application program therein, the model being adapted to be used in a computer simulation of the electronic device by executing the HDL application program on a processor of a computer system, the model comprising:
   a) a first path between a first port and a second port, the first path including a second NMOS device;
   b) a second path between the second port and the first port, the second path including a first NMOS device; and
   c) a control mechanism, the control mechanism checking signal values (S1) on the first port and signal values (S2) on the second port when a change is detected on the first port or the second port, the control mechanism enabling the second NMOS device when a change is detected on the first port and the first port does not equal the second port, the control mechanism enabling the first NMOS device when a change is detected on the second port and the first port does not equal the second port, wherein the second path further includes a third NMOS device and wherein the first path further includes a fourth NMOS device, wherein the third and fourth NMOS devices are tied on to function as pass data-devices, wherein the first path and second path are electrically in parallel, wherein the second NMOS device and the fourth NMOS device are electrically in series within the first path, wherein the first NMOS device and the third NMOS device are electrically in series within the second path, wherein the gates of the third and the forth NMOS devices are held high throughout the computer simulation of the electronic device, wherein the control mechanism comprises a first control output C1 directly coupled to the gate of the first NMOS device and a second control output C2 directly coupled to the gate of the second NMOS device, wherein the signal values (S1) at the first port are directly coupled to a source/drain of the first NMOS device, and wherein the signal values (S2) at the second port are directly coupled to a source/drain of the second NMOS device.

2. The model of claim 1, wherein a state of an NMOS device selected from the group consisting of the first NMOS device and the second NMOS device is dictated by the following truth table, wherein if the NMOS device is the first NMOS device then S denotes the signal values S1 and C denotes the control output C1, and wherein if the NMOS device is the second NMOS device then S denotes the signal values S2 and C denotes the control output C2, wherein L, denotes low, H denotes high, Z denotes high impedance, and X denotes undetermined:

|   |   | C | | | |
|---|---|---|---|---|---|
|   |   | 0 | 1 | X | Z |
| S | 0 | Z | 0 | L | L |
|   | 1 | Z | 1 | H | H |
|   | X | Z | X | X | X |
|   | Z | Z | Z | Z | Z. |

3. The model of claim 1, wherein the model is implemented in the VHDL hardware description language using Vital timing routines.

4. The model of claim 1, wherein the control mechanism enables the first path by enabling the second NMOS device when a change is detected on the first port and the first port does not equal the second port, and wherein the control mechanism enables the second path by enabling the first NMOS device when a change is detected on the second port and the first port does not equal the second port.

5. The model of claim 1, wherein the timing values are annotated into the model in the form of module input port delays annotated into the third NMOS device and the fourth NMOS device.

6. The model of claim 1, wherein the timing values are annotated into the model in the form of propagation delays across the first path and the second path.

7. The model of claim 1, wherein the control mechanism further disables the first NMOS device when a change is detected on the first port and the first port does not equal the second port, and wherein the control mechanism further disables second NMOS device when a change is detected on the second port and the first port does not equal the second port.

8. The model of claim 1 wherein the control mechanism uses HDL register values to detect the change on both the first port and the second port.

9. A method for representing a bidirectional wire input/output (I/O) during a computer simulation of an electronic device, the method comprising:

a) providing a model for the bidirectional wire I/O, the model including:

i) a first path between a first port and a second port; and ii) a second path between the second port and the first port;

b) checking signal values (S1) on the first port and signal values (S2) on the second port when a change is detected on the first port or the second port;

c) enabling the first path when a change is detected on the first port and the first port does not equal the second port;

d) enabling the second path when a change is detected on the second port and the first port does not equal the second port, wherein the model further includes a second NMOS device and a fourth NMOS device in the first path and further includes a first NMOS device and a third NMOS device in the second path, wherein the first path and the second path are electrically in parallel, wherein the second NMOS device and the fourth NMOS device are electrically in series within the first path, wherein the first NMOS device and the third NMOS device are electrically in series within the second path, wherein the gates of the third and fourth NMOS devices are held high throughout the computer simulation of the electronic device, wherein the control mechanism comprises a first control output C1 directly coupled to the gate of the first NMOS device and a second control output C2 directly coupled to the gate of the second NMOS device, wherein the signal values (S1) at the first port are directly coupled to a source/drain of the first NMOS device, and wherein the signal values (S2) at the second port are directly coupled to a source/drain of the second NMOS device.

10. The model of claim 9, wherein a state of an NMOS device selected from the group consisting of the first NMOS device and the second NMOS device is dictated by the following truth table, wherein the NMOS device is the first NMOS device then S denotes the signal values S1 and C denotes the control output C1, and wherein if the NMOS device is the second NMOS device then S denotes the signal values S2 and C denotes the control output C2, wherein L denotes low, H denotes high, Z denotes high impedance, and X denotes undetermined:

|   |   | C | | | |
|---|---|---|---|---|---|
|   |   | 0 | 1 | X | Z |
| S | 0 | Z | 0 | L | L |
|   | 1 | Z | 1 | H | H |
|   | X | Z | X | X | X |
|   | Z | Z | Z | Z | Z. |

11. The method of claim 9, further comprising the steps of:

e) disabling the second path when a change is detected on the first port and the first port does not equal the second port;

f) disabling the first path when a change is detected on the second port and the first port does not equal the second port.

12. The method of claim 9, further comprising the step of annotating timing values across the first path and the second path.

13. The method of claim 9, further comprising the step of annotating module input port delays into the third NMOS device and the fourth NMOS device.

14. The model of claim 9, wherein the control mechanism uses Hardware Description Language (HDL) register values to detect the change on both the first port and the second port.

15. A program product comprising:
A) a hardware description language model representing a bidirectional wire input/output (I/O) during a computer simulation of a electronic device, the hardware description language model including:
   i) a first path between a first port and a second port;
   ii) a second path between the second port and the first port; and
   iii) a control mechanism, the control mechanism checking signal values (S1) on the first port and signal values (S2) on the second port when a change is detected on the first port or the second port, the control mechanism enabling the first path when a change is detected on the first port and the first port does not equal the second port, the control mechanism enabling the second part when a change is detected on the second port and the first port does not equal the second port;
B) recordable media hearing the hardware description language model, wherein the first path comprises a second NMOS device and a fourth NMOS device, and wherein the second path comprises a first NMOS device and a third NMOS device, wherein the first path and the second path are electrically in parallel, wherein the second NMOS device and the fourth NMOS device are electrically in series within the first path, wherein the first NMOS device and the third NMOS device are electrically in series within the second path, wherein the gates of the third and fourth NMOS devices are held high throughout the computer simulation of the electronic device, wherein the control mechanism comprises a first control output C1 directly coupled to the gate of the first NMOS device and a second control output C2 directly coupled to the gate of the second NMOS device, wherein the signal values (S1) at the first port are directly coupled to a source/drain of the first NMOS device, and wherein the signal values (S2) at the second port are directly coupled to a source/drain of the second NMOS device.

16. The model of claim 15, wherein a state of an NMOS device selected from the group consisting of the first NMOS device and the second NMOS device is dictated by the following truth table, wherein if the NMOS device is the first NMOS device then S denotes the signal values S1 and C denotes the control output C1, and wherein if the NMOS device is the second NMOS device then S denotes the signal values S2 and C denotes the control output C2, wherein L denotes low, H denotes high, Z denotes high impedance, and X denotes undetermined:

|   |   | C |   |   |   |
|---|---|---|---|---|---|
|   |   | 0 | 1 | X | Z |
| S | 0 | Z | 0 | L | L |
|   | 1 | Z | 1 | H | H |
|   | X | Z | X | X | X |
|   | Z | Z | Z | Z | Z. |

17. The program product of claim 15, wherein the model is implemented in the VHDL hardware description language using Vital timing routines.

18. The program product of claim 15, wherein the control mechanism enables the first path by enabling the second NMOS device when a change is detected on the first port and the first port does not equal the second port, and wherein the control mechanism enables the second path by enabling the first NMOS device when a change is detected on the second port and the first port does not equal the second port.

19. The program product of claim 15, wherein the first NMOS device, the second NMOS device, the third NMOS device, and the fourth NMOS device comprise Verilog NMOS primitives.

20. The program product of claim 15, wherein timing values are annotated into the model that include module input port delays annotated into the third NMOS device and the fourth NMOS device.

21. The program product of claim 15, wherein timing values are annotated across the first path and the second path.

22. The program product of claim 21, wherein the timing values are annotated in the form of propagation delays annotated between the first port to the second port and between the second port to the first port.

23. The program product of claim 15, wherein the control mechanism further disables the second path when a change is detected on the first port and the first port does not equal the second port, and wherein the control mechanism further disables the first path when a change is detected on the second port and the first port does not equal the second port.

24. The model of claim 15, wherein the control mechanism uses Hardware Description Language (HDL) register values to detect the change on both the first port and the second port.

* * * * *

UNITED STATES PATENT AND TRADEMARK OFFICE
CERTIFICATE OF CORRECTION

PATENT NO. : 6,985,842 B2
DATED : January 10, 2006
INVENTOR(S) : Grupp et al.

It is certified that error appears in the above-identified patent and that said Letters Patent is hereby corrected as shown below:

<u>Column 1,</u>
Lines 13, 17 and 18, delete "modem" and insert -- modern --.

<u>Column 8,</u>
Line 66, delete "data-devices" and insert -- devices --.

<u>Column 11,</u>
Line 9, delete "model representing" and insert -- model for representing --.
Line 23, delete "part" and insert -- path --.
Line 26, delete "hearing" and insert -- bearing --.

Signed and Sealed this

Twenty-first Day of March, 2006

JON W. DUDAS
*Director of the United States Patent and Trademark Office*